United States Patent
Moeneclaey et al.

(10) Patent No.: US 11,855,654 B2
(45) Date of Patent: Dec. 26, 2023

(54) MULTICHANNEL SUCCESSIVE APPROXIMATION ANALOG-TO-DIGITAL CONVERTER

(71) Applicants: STMicroelectronics (Grenoble 2) SAS, Grenoble (FR); STMicroelectronics International N.V., Geneva (CH)

(72) Inventors: Nicolas Moeneclaey, Vourey (FR); Sri Ram Gupta, Up (IN)

(73) Assignees: STMicroelectronics (Grenoble 2) SAS, Grenoble (FR); STMicroelectronics International N.V., Geneva (CH)

( * ) Notice: Subject to any disclaimer, the term of this patent is extended or adjusted under 35 U.S.C. 154(b) by 31 days.

(21) Appl. No.: 17/707,113

(22) Filed: Mar. 29, 2022

(65) Prior Publication Data
US 2022/0321140 A1    Oct. 6, 2022

(30) Foreign Application Priority Data
Mar. 31, 2021  (FR) ...................................... 2103305

(51) Int. Cl.
*H03M 1/12*    (2006.01)
*H03M 1/46*    (2006.01)

(52) U.S. Cl.
CPC ........... *H03M 1/462* (2013.01); *H03M 1/122* (2013.01); *H03M 1/1245* (2013.01); *H03M 1/468* (2013.01)

(58) Field of Classification Search
CPC .... H03M 1/468; H03M 1/1245; H03M 1/804; H03M 1/462; H03M 1/38; H03M 1/466;
(Continued)

(56) References Cited

U.S. PATENT DOCUMENTS 5,691,722 A * 11/1997 Wang ..................... H03M 1/42
                                                     341/161
8,350,738 B2 * 1/2013 Sanduleanu ........ H03M 1/1061
                                                     341/120
(Continued)

OTHER PUBLICATIONS

Lee, Sung-Min et al.: "A 10-bit Single-Ended SAR ADC with Split Dual-Capacitive-Array for Multi-Channel Neural Recording System," IDEC Journal of Integrated Circuits and Systems, vol. 3, No. 1, Jan. 2017. (Year: 2017).*

(Continued)

*Primary Examiner* — Linh V Nguyen
(74) *Attorney, Agent, or Firm* — CROWE & DUNLEVY (57) ABSTRACT

A successive approximation analog-to-digital converter includes a digital-to-analog converter DAC configured to receive a digital signal. First conversion units of the DAC are configured to sample an analog signal via a first switch and provide a first level voltage. Each first conversion unit includes a first capacitor array and a first switch array controlled from the digital signal. A single second conversion unit of the DAC is configured to provide a second level voltage. The second conversion unit includes a second capacitor array and a second switch array. A comparator operates to compare each of the first level voltages to the second level voltage and to provide a comparison signal based on each comparison and actuation of a set of third switches. A control circuit closes the first switches simultaneously and closes the third switches successively for the conversion of each sampled analog signal.

16 Claims, 7 Drawing Sheets

(58) Field of Classification Search
CPC ...... H03M 1/001; H03M 1/06; H03M 1/0602;
H03M 1/1023; H03M 1/12; H03M 1/46;
H03M 1/00; H03M 1/10; H03M 1/1009;
H03M 1/1019; H03M 1/1225; H03M
1/442; H03M 1/662
USPC ................ 341/141, 142, 150, 155, 161, 172
See application file for complete search history.

(56) References Cited

U.S. PATENT DOCUMENTS

| | | | | |
|---|---|---|---|---|
| 8,736,480 | B1* | 5/2014 | Cowley | H03M 1/0626 341/172 |
| 8,884,801 | B1* | 11/2014 | Ranjbar | H03M 1/0609 341/163 |
| 8,947,283 | B2* | 2/2015 | Zhu | H03M 1/1215 341/122 |
| 9,768,795 | B1* | 9/2017 | Matsumoto | H03M 1/468 |
| 10,454,488 | B1* | 10/2019 | Monangi | H03M 1/462 |
| 11,018,684 | B1* | 5/2021 | Gupta | H03M 1/68 |
| 2007/0236380 | A1* | 10/2007 | La Rue | H03M 1/1245 341/155 |
| 2010/0151900 | A1* | 6/2010 | Koli | H03M 1/1215 341/172 |
| 2010/0237907 | A1* | 9/2010 | Santoro | H03K 5/249 327/77 |
| 2011/0128172 | A1* | 6/2011 | Srinivasa | H03M 1/002 341/172 |
| 2014/0232582 | A1* | 8/2014 | Lian | H03M 1/34 341/158 |
| 2021/0037201 | A1* | 2/2021 | Tantawy | H03M 1/442 |
| 2022/0077867 | A1* | 3/2022 | An | H03M 1/1061 |

OTHER PUBLICATIONS

Sung-Min et al.: "A 10-bit Single-Ended SAR ADC with Split Dual-Capacitive-Array for Multi-Channel Neural Recording System," IDEC Journal of Integrated Circuits and Systems, vol. 3, No. 1, Jan. 2017 (Year: 2017).*

INPI Search Report and Written Opinion for priority application, FR Appl. No. 2103305, report dated Dec. 9, 2021, 9 pages.

Liew, Wen-Sin, et al.: "A 0.5-V 1.13-µW/Channel Neural recording Interface with Digital Multiplexing Scheme," 2011, IEEE, 4 pages.

Lee, Sung-Min et al: "A 10-bit Single-Ended SAR ADC with Split Dual-Capacitive-Array for Multi-Channel Neural Recording System," IDEC Journal of Integrated Circuits and Systems, vol. 3, No. 1, Jan. 2017, 6 pages.

* cited by examiner

MULTICHANNEL SUCCESSIVE APPROXIMATION ANALOG-TO-DIGITAL CONVERTER

PRIORITY CLAIM

This application claims the priority benefit of French Application for Patent No. 2103305, filed on Mar. 31, 2021, the content of which is hereby incorporated by reference in its entirety to the maximum extent allowable by law.

TECHNICAL FIELD

The present disclosure generally relates to electronic devices and, more particularly, to multichannel successive approximation analog to digital converters.

BACKGROUND

Successive approximation analog to digital converters (SA-ADC) are often used to generate digital codes representing corresponding samples of an analog signal received as input. SA-ADCs employ the successive approximation principle (SAP) for generation of the digital codes. Approximations of the analog signal are generated and compared with the analog signal until the digital codes representing the approximations have been resolved to the accuracy of number of bits available in the SA-ADC for representing a sample of the analog signal.

For some applications, several analog signals need to be converted into digital signals. It may not be possible to use a single SA-ADC converting successively each analog signal when the analog signals have to be sampled simultaneously. However, the use of several SA-ADCs to carry out simultaneously the conversions may result in an expensive multichannel SA-ADC.

There is a need in the art to overcome all or part of the disadvantages of known multichannel successive approximation AC/DC converters.

SUMMARY

An embodiment provides a successive approximation analog-to-digital converter comprising: a digital-to-analog converter configured to receive a digital signal, said digital-to-analog converter comprising first conversion units, each first conversion unit being configured to sample an analog signal via a first switch and provide a first level voltage via a second switch; a single second conversion unit configured to provide a second level voltage; wherein each first conversion unit comprises a first capacitor array and a first switch array controlled from the digital signal; wherein the second conversion unit comprises a second capacitor array and a second switch array; a comparator configured to receive one of the first level voltages at a time and to receive the second level voltage and to provide a comparison signal based on the comparison between said one of the first level voltages and the second level voltage; a successive approximation logic circuit configured to provide the digital signal based on the comparison signal; and a control circuit configured to close the first switches simultaneously and close the second switches successively for the conversion of each sampled analog signal.

Another embodiment provides a method of successive approximation analog-to-digital conversion comprising: providing a digital-to-analog converter receiving a digital signal, said digital-to-analog converter comprising first conversion units, each first conversion unit sampling an analog signal via a first switch and providing a first level voltage via a second switch, said digital-to-analog converter further comprising a single second conversion unit providing a second level voltage, each first conversion unit comprising a first capacitor array and a first switch array controlled from the digital signal, the second conversion unit comprising a second capacitor array and a second switch array; comparing by a comparator one of the first level voltages at a time and the second level voltage and providing a comparison signal based on the comparison between said one of the first level voltages and the second level voltage; providing, by a successive approximation logic circuit, the digital signal based on the comparison signal; and having a control circuit closing the first switches simultaneously and closing the second switches successively for the conversion of each sampled analog signal.

According to an embodiment, the second conversion unit comprises a third switch receiving a first reference voltage, the control circuit being configured to sample the first reference voltage for each conversion of the sampled analog signals.

According to an embodiment, for each first conversion unit, the first capacitor array comprises first capacitors, each having a first plate connected to the second switch and a second plate connected to the first switch, and the first switch array comprises, for each first capacitor, a fourth switch connecting the second plate of the first capacitor to the first reference voltage and a fifth switch connecting the second plate of the first capacitor to a second reference voltage.

According to an embodiment, each first conversion unit comprises a sixth switch connecting the first plate of each first capacitor to the first reference voltage.

According to an embodiment, the second capacitor array comprises second capacitors, each having a first plate coupled to the comparator and a second plate connected to the third switch, and the second switch array comprises, for each second capacitor, a seventh switch connecting the second plate of the second capacitor to the first reference voltage and an eighth switch connecting the second plate of the second capacitor to the second reference voltage.

According to an embodiment, the second conversion unit comprises a ninth switch connecting the first plate of each second capacitor to the first reference voltage.

According to an embodiment, the sixth switch and/or the ninth switch comprises: a first MOS transistor, the drain of the first MOS transistor receiving the first reference voltage, and the source of the first MOS transistor receiving the first level voltage or the second level voltage; a second MOS transistor, the source of the second MOS transistor receiving a third reference voltage, the drain of the second MOS transistor being connected to the gate of the first MOS transistor, and the gate of the second MOS transistor receiving a command signal; a third capacitor having a first plate connected to the gate of the first MOS transistor; and an inverter having its output connected to the second plate of the third capacitor and receiving the command signal.

Another embodiment provides a sensing device comprising a sensor providing unshaped analog signals, an analog processor receiving the unshaped analog signals and providing shaped analog signals, a successive approximation analog-to-digital converter as previously defined receiving the shaped analog signals and providing, for each shaped analog signals, a digital signal corresponding to the analog-to-digital conversion of the shaped analog signal, and a processing unit receiving the digital signals.

According to an embodiment, the sensor comprises photodetectors.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the circuits implementing the successive approximation principle in an SA-ADC have not been detailed, the described embodiments being compatible with usual applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

Figure 1:
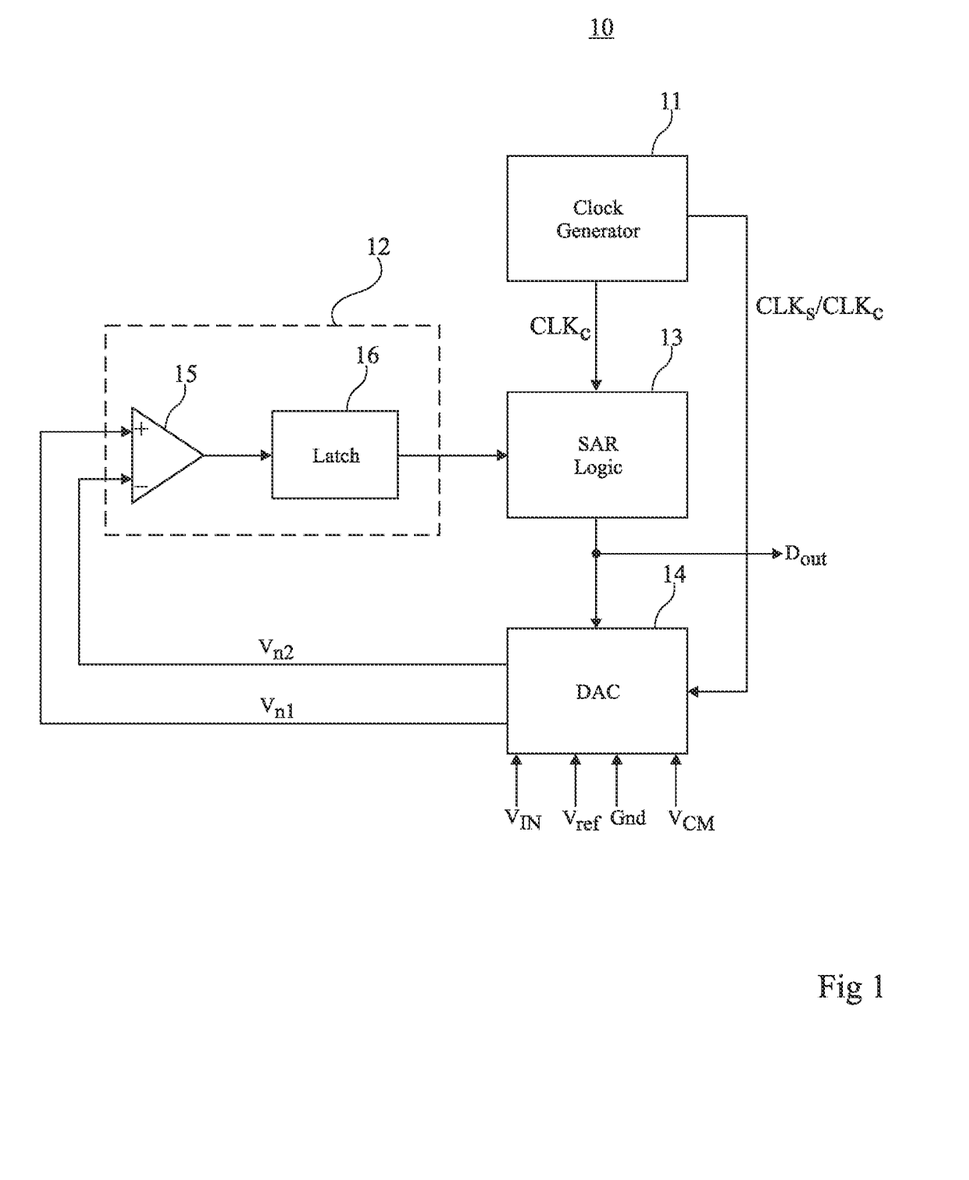
FIG. 1 is a block diagram of a successive approximation analog to digital converter (SA-ADC)

FIG. 1 is a block diagram schematically illustrating a successive approximation analog to digital converter (SA-ADC) 10.

SA-ADC 10 may include a clock generator 11, a comparator 12, a successive approximation register circuit 13 (hereinafter, referred to as SAR logic), and a digital-to-analog converter 14 (hereinafter, referred to as DAC). SA-ADC 10 may receive an analog signal $V_{IN}$, a low reference voltage Gnd, a high reference signal $V_{ref}$, and a common mode voltage $V_{CM}$ and provides a digital signal $D_{out}$.

The clock generator 11 may generate a sampling clock CLKs and a conversion clock $CLK_C$. The sampling clock CLKs may be transferred to the DAC 14, and the conversion clock $CLK_C$ may be transferred to the SAR logic 13 and the DAC 14. The DAC 14 may sample the input voltage $V_{IN}$ in response to the sampling clock CLKs. The DAC 14 may generate first and second level voltages $V_{n1}$ and $V_{n2}$ in response to the conversion clock $CLK_C$.

The comparator 12 may compare the first and second level voltages $V_{n1}$ and $V_{n2}$. The comparator 12 may include a differential amplifier 15 and a latch 16. The differential amplifier 15 may compare the first and second level voltages $V_{n1}$ and $V_{n2}$ to amplify a comparison result. As an example, the differential amplifier 15 comprises a non-inverting input (+) receiving the first level voltage $V_{n1}$ and an inverting input (−) receiving the second level voltage $V_{n2}$.

The latch 16 may store data '0' or data '1' based on an output of the differential amplifier 15. For example, when the first level voltage $V_{n1}$ is higher than the second level voltage $V_{n2}$, the latch 16 may store data '1'. When the first level voltage $V_{n1}$ is lower than the second level voltage $V_{n2}$, the latch 16 may store data '0'.

The SAR logic 13 may operate responsive to the conversion clock $CLK_C$ and may decide a digital bit based on data stored in the latch 16.

The DAC 14 may output the first and second level voltages $V_{n1}$ and $V_{n2}$ based on the analog input voltage $V_{IN}$, the low reference voltage Gnd, the high reference voltage $V_{ref}$, and the common mode voltage $V_{CM}$, and a digital signal received from the SAR logic 13. The low reference voltage Gnd may correspond to the ground, and taken equal to 0 V. The high reference voltage $V_{ref}$ may correspond to a power supply voltage. The common mode voltage $V_{CM}$ may be a half of the power supply voltage.

Figure 2:
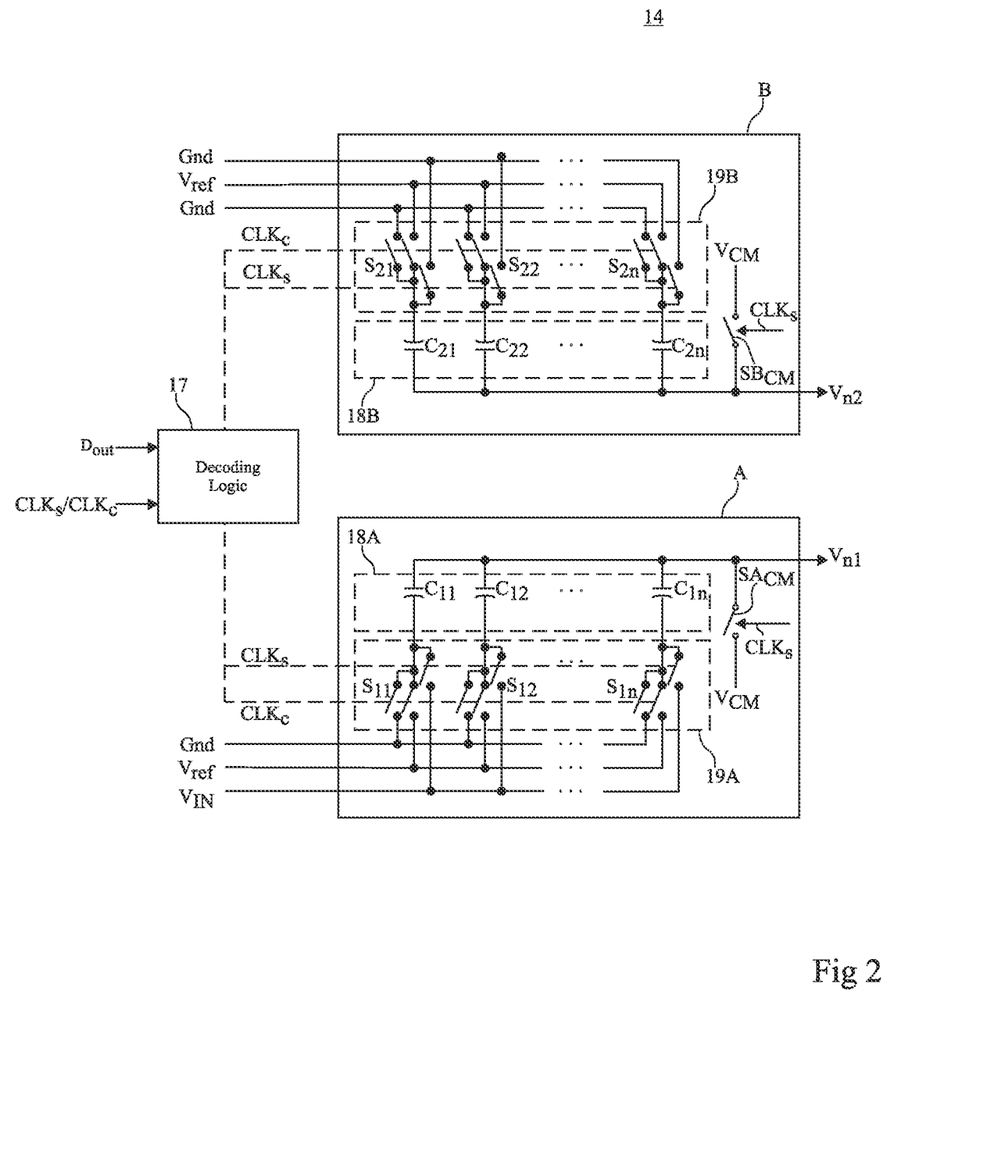
FIG. 2 partially and schematically shows an embodiment of a DAC circuit of the SA-ADC of FIG. 1.

FIG. 2 is a detailed circuit diagram illustrating the DAC 14 of FIG. 1.

The DAC 14 may include a first conversion unit A, a second conversion unit B, and a decoding logic 17. The first conversion unit A may generate the first level voltage $V_{n1}$. The second conversion unit B may generate the second level voltage $V_{n2}$. The decoding logic 17 may receive the digital signal $D_{out}$ from the SAR logic 13. The decoding logic 17 may receive the sampling clock CLKs and the conversion clock $CLK_C$.

The first conversion unit A may include a first capacitor array 18A, a first switch array 19A, and first sampling switch SWA, and a first common mode switch $SA_{CM}$.

The first capacitor array 18A may include a plurality of first capacitors $C_{11}$ to $C_{1n}$. The first capacitors $C_{11}$ to $C_{1n}$ may have different capacitances. The number n of the first capacitors $C_{11}$ to $C_{1n}$ may depend on the digital resolution of the SA-ADC 10. The capacitances of the first capacitors $C_{11}$ to $C_{1n}$ may be different. As an example, the capacitance of the capacitor $C_{1i}$ is equal to $2^i * C$, where C is the capacitance of capacitor $C_{11}$. For example, in the case that the SA-ADC 10 has a 3-bit digital resolution, the first capacitor array A may include three first capacitors having different capacitances. A first plate of each first capacitor $C_{11}$ to $C_{1n}$ is connected to an output line providing the first level voltage $V_{n1}$. The first plate of each first capacitor $C_{11}$ to $C_{1n}$ is connected, via the first common mode switch $SA_{CM}$, to a terminal providing the common mode voltage $V_{CM}$. The first common mode switch $SA_{CM}$ may be controlled by the sampling clock CLKs.

The first switch array 19A may include a plurality of first switches $S_{11}$ to $S_{1n}$. Each first switch $S_{11}$ to $S_{1n}$ is connected to the second plate of a corresponding first capacitor $C_{11}$ to $C_{1n}$ of the first capacitor array 18A. The first switch array 19A may supply, during a conversion step in response to the conversion clock $CLK_C$, either the low reference voltage Gnd, or the high reference voltage $V_{ref}$, or, during a sampling step in response to the sampling clock CLKs, the input voltage $V_{IN}$ to the second plate of each first capacitor $C_{11}$ to $C_{1n}$ of the first capacitor array 18A according to a control of the decoding logic 17.

The second conversion unit B may include a second capacitor array 18B, a second switch array 19B, and second sampling switch SWB, and a second common mode switch $SB_{CM}$.

The second capacitor array 18B may include a plurality of second capacitors $C_{21}$ to $C_{2n}$. The number of the second capacitors $C_{21}$ to $C_{2n}$ may the same as the number of the first capacitors $C_{11}$ to $C_{1n}$. The capacitances of the second capacitors $C_{21}$ to $C_{2n}$ may be different. As an example, the capacitance of the capacitors $C_{21}$ is equal to the capacitance of the capacitor $C_{11}$. A first plate of each second capacitor $C_{21}$ to $C_{2n}$ is connected a line providing the second level voltage $V_{n2}$. A first plate of each second capacitor $C_{21}$ to $C_{2n}$ is connected to an output line providing the second level voltage $V_{n2}$. The first plate of each second capacitor $C_{21}$ to $C_{2n}$ is connected, via the second common mode switch $SB_{CM}$, to a terminal providing the common mode voltage $V_{CM}$. The second common mode switch $SB_{CM}$ may be controlled by the sampling clock CLKs.

The second switch array 19B may include a plurality of second switches $S_{21}$ to $S_{2n}$. Each second switch $S_{21}$ to $S_{2n}$ is connected to the second plate of a corresponding second capacitor $C_{21}$ to $C_{2n}$ of the second capacitor array 18B. The second switch array 19B may supply, during a conversion step in response to the conversion clock $CLK_C$, either the low reference voltage Gnd or the high reference voltage $V_{ref}$, or, during a sampling step in response to the sampling clock CLKs, the low reference voltage Gnd to a second plate of each second capacitor $C_{21}$ to $C_{2n}$ of the second capacitor array 18B according to a control of the decoding logic 17.

The decoding logic 17 may, during a conversion, selectively control the switches $S_{11}$ to $S_{1n}$ of the first switch array 19A at the rate of the conversion clock $CLK_C$ such that the low reference voltage Gnd, or the high reference voltage $V_{ref}$ is supplied to the second plates of capacitors $C_{11}$ to $C_{1n}$ of the first capacitor array 18A. The decoding logic 17 may selectively control the switches $S_{21}$ to $S_{2n}$ of the second switch array 19B such that, during the whole conversion, one of the low reference voltage Gnd and the high reference voltage $V_{ref}$ is supplied to the second plates of capacitors $C_{21}$ to $C_{2n}$ of the second capacitor array 18B.

The first capacitor array 18A may sample the analog input voltage $V_{IN}$ at the rate of the sampling clock CLKs. As an example, the common mode voltage $V_{CM}$ may be applied to the first plate of each first capacitor $C_{11}$ to $C_{1n}$ by closing the first common mode switch $SA_{CM}$, and the input voltage $V_{IN}$ may be applied to the second plate of each first capacitor $C_{11}$ to $C_{1n}$ by closing the appropriate first switches $S_{11}$ to $S_{1n}$. By opening the first switches $S_{11}$ to $S_{1n}$ and the first common mode switch $SA_{CM}$, the voltage $V_{IN}$ is held on the second plate of each first capacitor $C_{11}$ to $C_{1n}$ and the common mode voltage is held on the second plate of each first capacitor $C_{11}$ to $C_{1n}$. The second capacitor array 18B may sample the low reference voltage Gnd at the rate of the sampling clock CLKs. As an example, the first plate of each second capacitor $C_{21}$ to $C_{2n}$ may be connected to the common mode voltage $V_{CM}$ by closing the second common mode switch $SB_{CM}$, and the second plate of each second capacitor $C_{21}$ to $C_{2n}$ may be connected to the low reference voltage Gnd by closing the appropriate second switches $S_{21}$ to $S_{2n}$. By opening the second switches $S_{21}$ to $S_{2n}$ and the second common mode switch $SB_{CM}$, the low reference voltage Gnd is held on the second plate of each second capacitor $C_{21}$ to $C_{2n}$ and the common mode voltage is held on the second plate of each second capacitor $C_{21}$ to $C_{2n}$.

The digital signal $D_{out}$ may then be determined by successive approximation principle by generating new values for the first level voltage $V_{n1}$ at the rate of the conversion clock $CLK_C$. As for example, each bit of the digital signal $D_{out}$ may be successively determined from the most significant bit (MSB) to the least significant bit (LSB). However, other methods using the successive approximation principle may be carried out.

For determining the MSB of the digital signal $D_{out}$, the first level voltage $V_{n1}$ may be obtained by controlling the switches $S_{11}$ to $S_{1n}$ to supply the high reference voltage $V_{ref}$ to the second plate of each first capacitor $C_{11}$ to $C_{1n}$. The second level voltage $V_{n2}$ may be obtained by controlling the switches $S_{21}$ to $S_{2n}$ to supply low reference voltage Gnd or the high reference voltage $V_{ref}$ to the second plate of each second capacitor $C_{21}$ to $C_{2n}$. The value of the second level voltage $V_{n2}$ may not be modified during the conversion.

The first and second level voltages $V_{n1}$ and $V_{n2}$ may be transferred to the comparator 12. Afterwards, the comparator 12 stores '0' or '1' in the latch 16 based on the comparison between level voltages $V_{n1}$ and $V_{n2}$. The SAR logic 13 may decide the MSB based on data stored in the latch 16. In a case where data '1' is stored at the latch 16, the SAR logic 13 may decide the MSB to be logically high. In a case where data '0' is stored in the latch 16, the SAR logic may decide the MSB to be logically low. For example, a most significant bit MSB of the digital signal $D_{out}$ received at an MSB deciding operation may be logically high. In this case, the decoding logic 17 may control the first switch $S_{1n}$ in response to the conversion clock $CLK_C$ such that the low reference voltage Gnd is supplied to the second plate of capacitor $C_{11}$. The decoding logic 17 may control the remaining switches $S_{12}$ to $S_{1n}$ such that the high reference voltage is supplied to the second plates of the remaining capacitors $C_{1i}$. The previously disclosed method can be repeated to determine successively each bit the digital signal $D_{out}$ up to the LSB.

The use of the second conversion unit B, which has a structure similar to the first conversion unit A, allow the errors due to the switches $SA_{CM}$ and the switch $SB_{CM}$ to be compensated For some applications, an electronic device may supply several analog signals that need to be converted into digital signals. The electronic device may correspond to a sensor, for example a light sensor comprising pixels that provide several analog signals to be converted.

A possibility is to use only one converter as the SA-ADC 10 shown in FIGS. 1 and 2 and to convert the analog signals successively with the SA-ADC 10. However, for some applications, the several analog signals to be converted have to be sampled simultaneously. That can be the case for a light sensor comprising pixels, each pixel providing an analog signal that depends on the luminous intensity received by the pixel during an integration period. Indeed, the integration periods for all the pixels may have to start and finish simultaneously. The analog signal provided by each pixel may be sampled at the beginning and at the end of the integration period and each sampled analog signal may be converted in a digital signal.

In this case, in order to convert the analog signals successively, each sampled analog signal may be stored in a capacitor, and the stored signals can be converted successively by the single SA-ADC. However, the capacitances of the storage capacitors have to be high enough, preferably higher than 10 pF to avoid additional important noise.

Another possibility is to use five converters as the SA-ADC 10 shown in FIGS. 1 and 2. However, the SA-ADC 10 shown in FIGS. 1 and 2 may occupy a large surface area, in particular due to the first capacitor array 18A and the second capacitor array 19A of the converter 10 that occupy substantially 80% of the surface area of the converter 10. That is why five copies of the converter 10 may occupy a too high surface area.

Figure 3A:
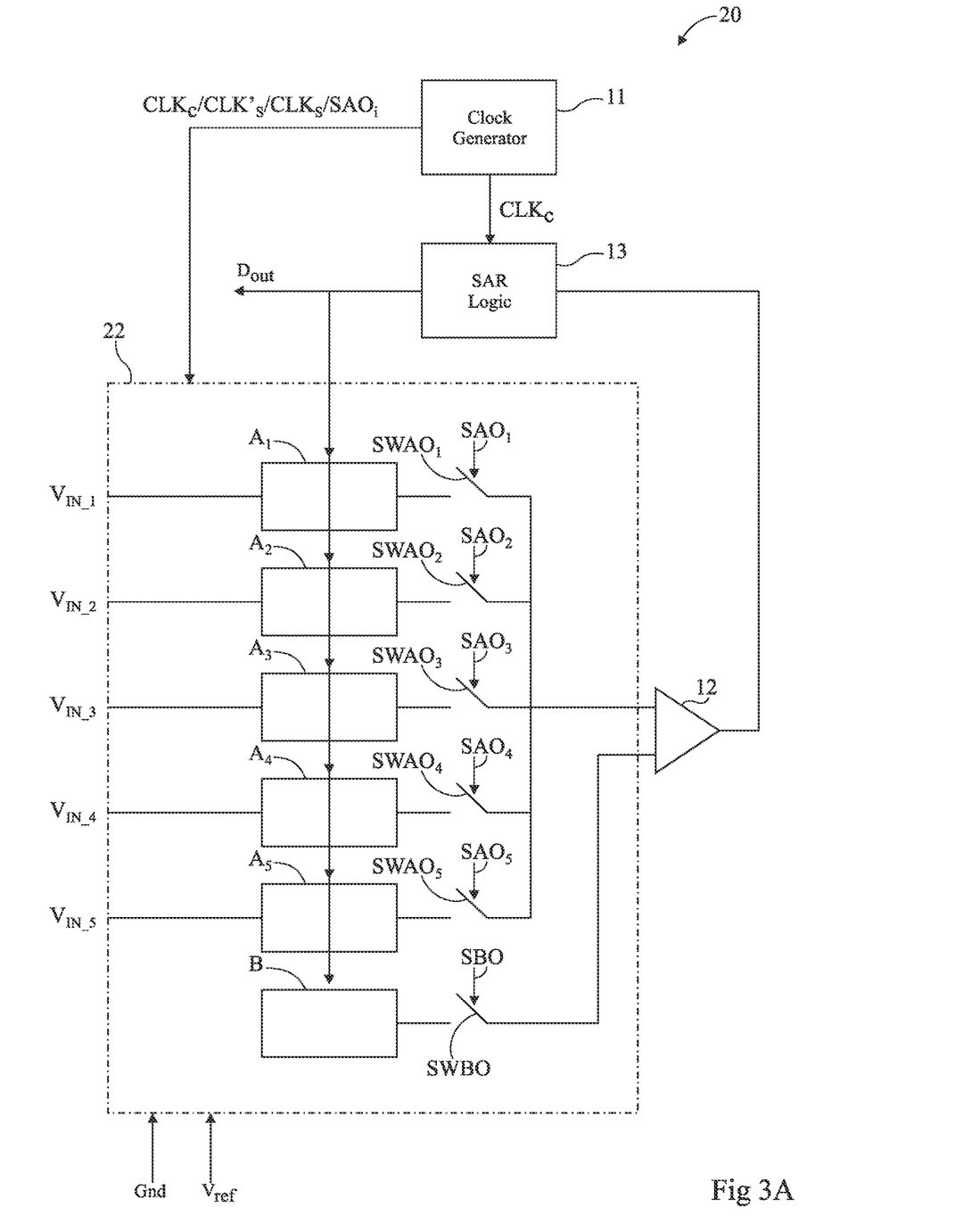
FIGS. 3A and 3B are block diagrams of embodiment of a multichannel SA-ADC.

FIG. 3A is a block diagram of an embodiment of a multichannel SA-ADC 20. The multichannel SA-ADC 20 comprises all the elements of the SA-ADC 10 of FIG. 1 except that the DAC 14 is replaced by multichannel digital-to-analog converter 22. The DAC 22 comprises several copies of the first conversion unit $A_1$ to $A_N$, where N is an integer equal to the number of the sources of analog signals. As an example, in FIG. 3, N is equal to 5.

Figure 3B:
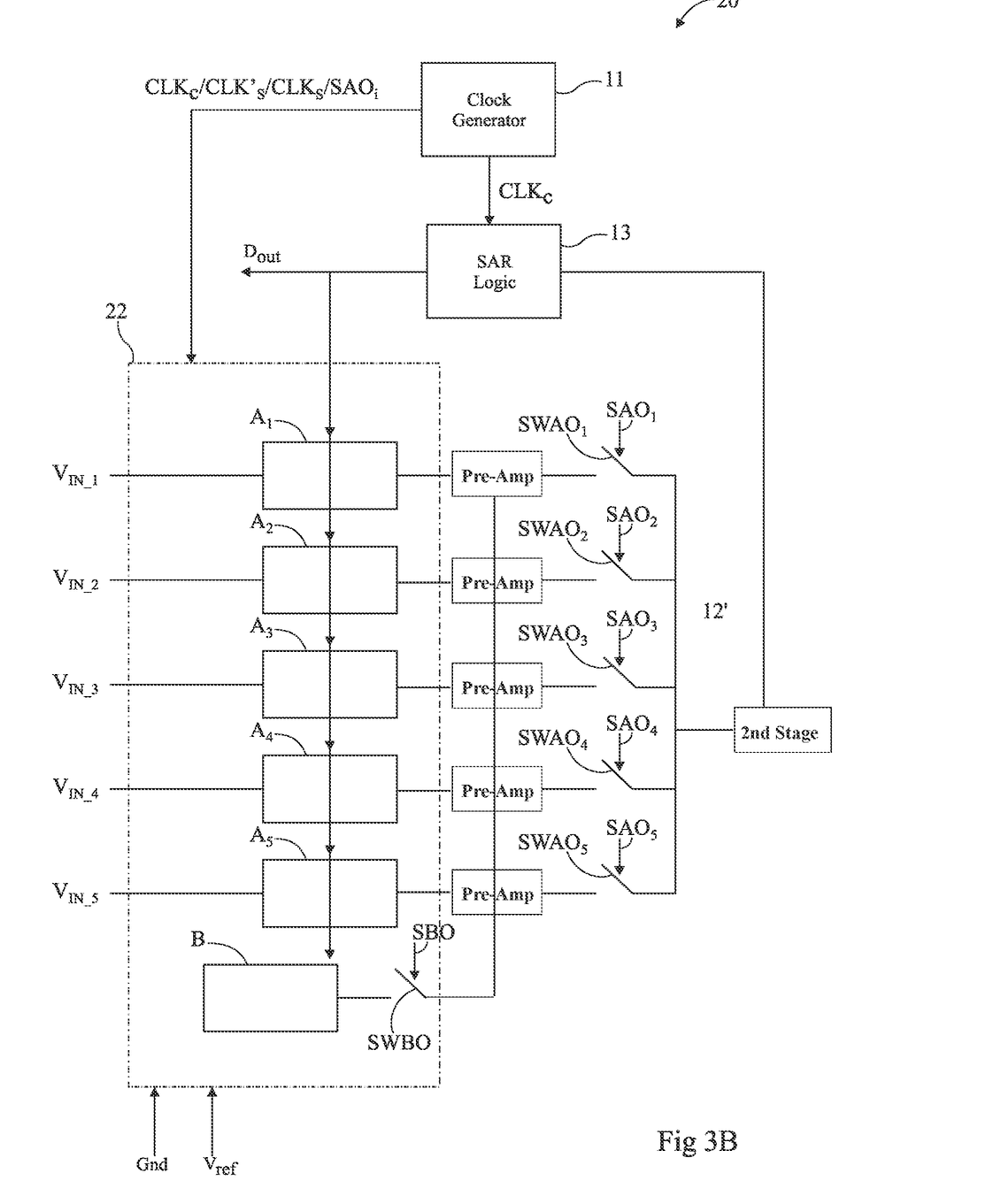

FIG. 3B is a block diagram of an embodiment of a multichannel SA-ADC 20'. The embodiment of FIG. 3B differs from the embodiment of FIG. 3A in the configuration of the comparator 12' and the placement of the switches $SWAO_i$. While the comparator 12 is configured in a conventional manner to have a pre-amplifier stage and second stage (where the pre-amplifier stage performs the differential comparison of the two input signals and the second stage comprises the latch circuit 16 for latching the logic state representative of the comparison result), the comparator 12' includes a separate pre-amplifier stage for each conversion unit $A_i$. In this case, each separate pre-amplifier stage performs a differential comparison of the one input from a corresponding conversion unit A and another input from the conversion unit B. The outputs of the pre-amplifier stages are selectively passed by the switches $SWAO_i$ to the input of the second stage latch circuit 16 which is shared. The output of the second stage is passed to the SAR logic 13.

Figure 4:
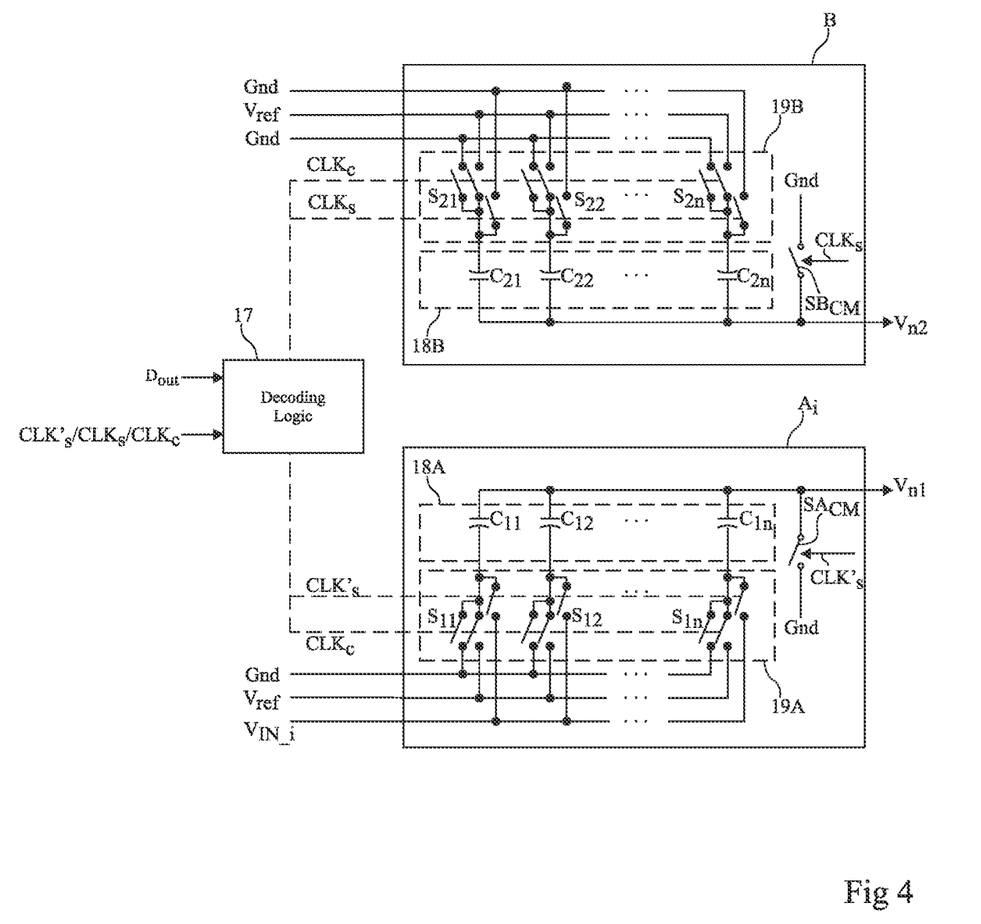
FIG. 4 partially and schematically shows an embodiment of a DAC circuit of the SA-ADC of FIGS. 3A and 3B.

FIG. 4 is a detailed circuit diagram illustrating a part of the DAC 22 of FIGS. 3A and 3B. Each first conversion unit $A_i$ may have the structure of the first conversion unit A shown in FIG. 2 with the difference that the common mode voltage $V_{CM}$ is replaced by the low reference voltage Gnd. Each first conversion unit $A_i$ receives an analog signal to be converted corresponding to the analog signal $V_{IN}$ of FIG. 2. The output of each first conversion unit $A_i$, i being an integer varying from 1 to N, is connected to the non-inverting input of the comparator 12 via an output switch $SWAO_i$ controlled by signal $SAO_i$ in the FIG. 3A embodiment, and instead directly connected to the non-inverting input of a corresponding pre-amplifier stage of the comparator 12' in the FIG. 3B embodiment (where the output switch $SWAO_i$ controlled by signal $SAO_i$ selectively passes the pre-amplifier stage output to the second stage). In either FIG. 3A or 3B, only one of the switches $SWAO_i$ may be closed at a time. The first common mode switch $SA_{CM}$ may be controlled by a sampling clock CLK's, and the switch array 19A may supply, in response to the conversion clock $CLK_C$, either the low reference voltage Gnd, or the high reference voltage $V_{ref}$, or, in response to the sampling clock CLK's, the input voltage $V_{IN\_i}$ to the second plate of each first capacitor $C_{11}$ to $C_{1n}$ of the first capacitor array 18A according to a control of the decoding logic 17.

The DAC 22 also comprises a single second conversion unit B having the structure shown in FIG. 2 with the difference that the common mode voltage $V_{CM}$ is replaced by the low reference voltage Gnd. The output of the second conversion unit B is connected to the inverting input of the comparator 12 (in the FIG. 3A embodiment) or to the inverting inputs of the pre-amplifier stages of the comparator 12' (in the FIG. 3B embodiment) via an output switch SWBO controlled by a signal SBO. Signal CLK's and signals $SAO_i$ and SBO may be provided by the clock generator 11. Sampling signal CLK's may correspond to sampling signal CLKs divided by the number of analog signals to be sampled. Signal SBO may correspond to the opposite of signal CLKs.

Each first conversion unit $A_i$ may supply first voltage level $V_{n1}$ as previously disclosed. The second conversion unit B may supply second voltage level $V_{n2}$ as previously disclosed.

Figure 5:
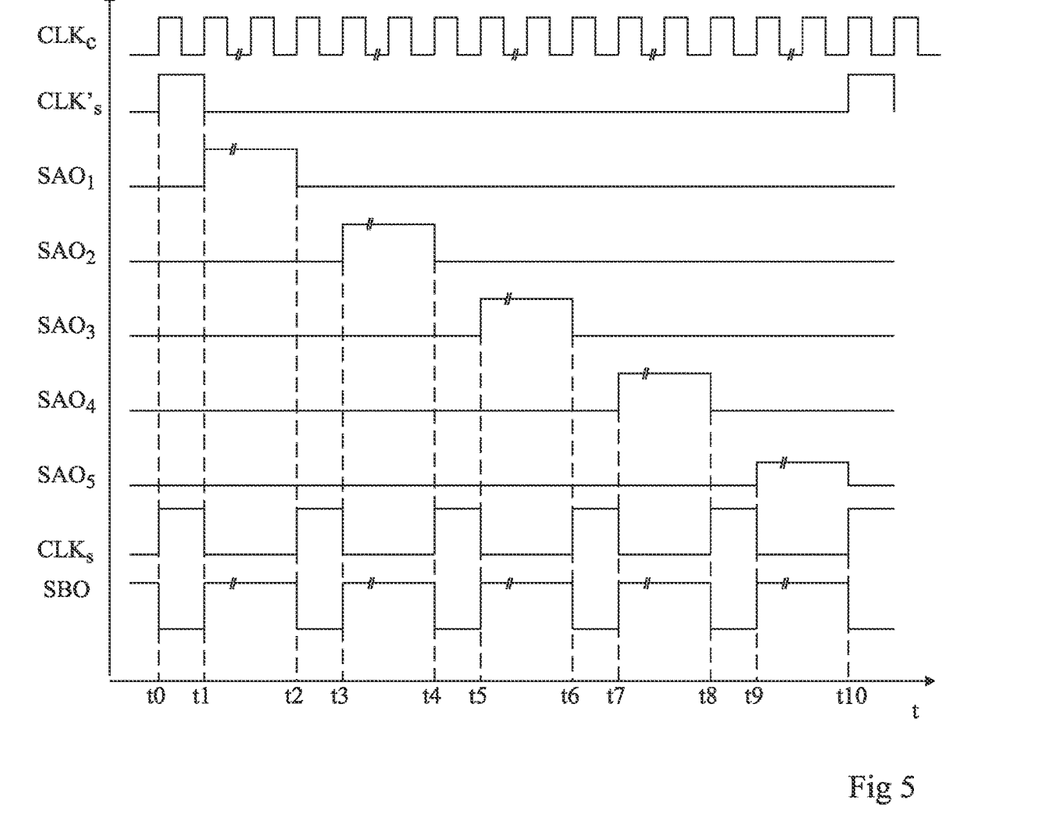
FIG. 5 shows chronograms of signals during the operation of the multichannel SA-ADC of FIG. 3.

FIG. 5 shows chronograms of signals $CLK_C$, CLKs, CLK's, $SAO_1$, $SAO_2$, $SAO_3$, $SAO_4$, $SAO_5$, and SBO during the operation of the multichannel SA-ADC 20, 20'. Instants t0 to t10 are successive. By way of illustration, it is considered in the following that when each signal CLKs, CLK's, $SAO_1$, $SAO_2$, $SAO_3$, $SAO_4$, $SAO_5$, and SBO is at level '1', the switch controlled by this signal is closed, and when each CLKs, $SWAO_1$, $SWAO_2$, $SWAO_3$, $SWAO_4$, $SWAO_5$, and SWBO is at level '0', the switch controlled by this signal is open.

The conversion cycle of the five analog signals $V_{IN\_1}$ to $V_{IN\_5}$ takes place between instants t0 and t10. Instant t0 correspond to the beginning of an integration phase or to the end of an integration phase. Between instants t0 and t1, signal CLK's is at level '1' and all the signals $SWAO_1$, $SWAO_2$, $SWAO_3$, $SWAO_4$, $SWAO_5$, and SWBO are at level '0'. Therefore, each analog signal $V_{IN\_i}$, varying from 1 to 5, is sampled in the corresponding first conversion unit $A_i$. At instant t1, signal CLK's is set to '0', the sampled signal of the analog signal $V_{IN\_i}$ is stored in the corresponding first conversion unit $A_i$. Between instants t0 and t1, the low reference voltage Gnd is sampled in the second conversion unit B. At instant t1, signal CLKs is set to '0', the sampled signal of the low reference voltage Gnd is stored in the second conversion unit B.

Between instants t1 and t2, the switches $SWAO_1$ and SWBO are closed. The first conversion unit $A_1$ and the second conversion unit B are controlled as previously disclosed to obtain a digital conversion of the sampled analog signal $V_{IN\_1}$.

Between instants t2 and t3, the switch SWBO is open. The low reference voltage Gnd is sampled in the second conversion unit B. At instant t3, the signal CLKs is set to '0', the sampled signal of the low reference voltage Gnd is stored in the second conversion unit B. Between instants t3 and t4, the switch $SWAO_2$ and SWBO are closed. The first conversion unit $A_2$ and the second conversion unit B are controlled as previously disclosed to obtain a digital conversion of the sampled analog signal $V_{IN\_2}$.

The same steps are repeated successively for the conversions of the sampled analog signal $V_{IN\_3}$ between instants t5 and t6, the sampled analog signal $V_{IN\_4}$ between instants t7 and t8, and eventually the sampled analog signal $V_{IN\_5}$ between instants t9 and t10, preceded each time by the sampling of the low reference voltage Gnd in the second conversion unit B (between instants t4 and t5, instants t6 and t7, and instants t8 and t9).

The steps previously disclosed between instants t0 and t10 can be repeated each time that a conversion of the analog signals $V_{IN\_1}$ to $V_{IN\_5}$ is to be carried out.

With respect to the SA-ADC 10 of FIG. 1 in which the common mode voltage $V_{CM}$ is sampled by the second conversion unit B, in the present embodiment of the SA-ADC 20, 20', it is the low reference voltage Gnd that is sampled by the second conversion unit B. This is advantageous given that the low reference voltage Gnd is a more stable voltage than the common mode voltage $V_{CM}$ and that, during a conversion cycle of the SA-ADC 20, 20' the sampling of the analog signals $V_{IN\_1}$ to have $V_{IN\_5}$ is not simultaneous with most of the samplings of the low reference voltage Gnd.

With respect to a multichannel SA-ADC comprising five DACs, the multichannel SA-ADC 20 according to the present embodiment comprises six capacitance arrays instead of ten capacitance arrays and also one comparator 15 instead of five comparators. The area surface gain may be around 40% to 50%.

With respect to a multichannel SA-ADC comprising only one converter as the SA-ADC 10 shown in FIGS. 1 and 2 and capacitors to store each sampled analog signal, the capacitances of the capacitors are usually bigger than the capacitances of the first conversion units $A_i$ of the multichannel SA-ADC 20, 20' according to the present embodiment so that the total capacitance of the multichannel SA-ADC 20, 20' according to the present embodiment to be provided is therefore advantageously decreased.

Figure 6:
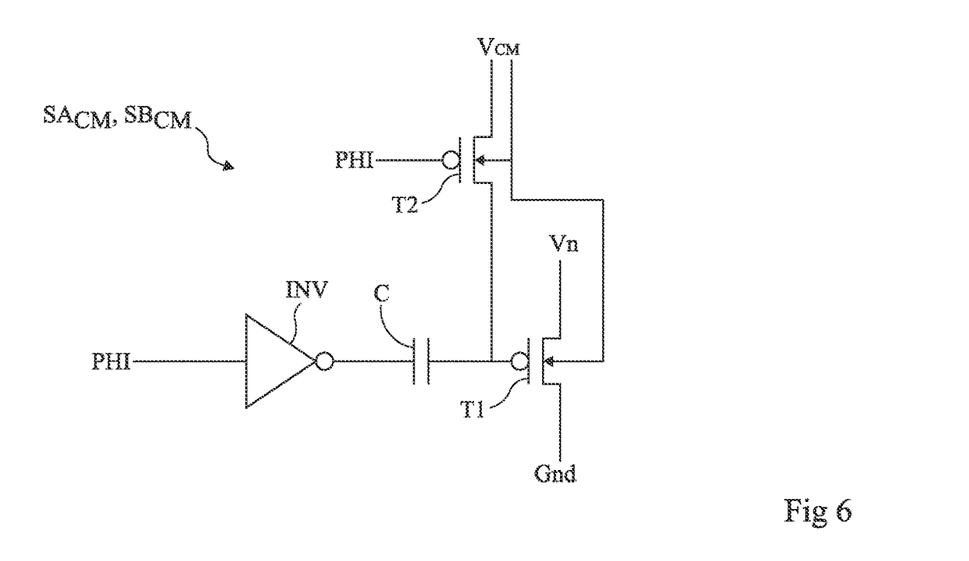
FIG. 6 partially and schematically shows an embodiment of a switch of the SA-ADC of FIGS. 3A and 3B.

FIG. 6 shows an embodiment of a switch that can correspond to the switch $SA_{CM}$ and the switch $SB_{CM}$. It is advantageously used in case the $SA_{CM}$ and $SB_{CM}$ switches are connected to GND and not $V_{CM}$.

Switch $SA_{CM}$, $SB_{CM}$ comprises a first p-channel MOS transistor T1 having its drain receiving the low reference voltage Gnd, and having its source receiving the level voltage $V_n$. The level voltage $V_n$ is equal to the level voltage $V_{n1}$ for the first conversion unit $A_i$ or to the level voltage $V_{n2}$ for the second conversion unit B. Switch $SA_{CM}$, $SB_{CM}$ further comprises a second p-channel MOS transistor T2 having its source receiving the common mode voltage $V_{CM}$ and having its drain connected to the gate of transistor T1. The gate of transistor T2 is controlled by a control signal PHI. Switch $SA_{CM}$, $SB_{CM}$ further comprises an inverter INV and a capacitor C. The input of the inverter INV receives the control signal PHI and the output of the inverter INV is connected to a first plate of capacitor C. The second plate of capacitor C is connected to the gate of transistor T1. The bulk of transistor T1 and the bulk of transistor T2 receive the common mode voltage $V_{CM}$.

Switch $SA_{CM}$, $SB_{CM}$ is closed when transistor T1 is turned on and switch $SA_{CM}$, $SB_{CM}$ is open when transistor T1 is turned off. When the control signal PHI is set at '0', transistor T2 is turned on. The second plate of capacitor C is brought to the common mode voltage $V_{CM}$ and transistor T1 is turned off. The first plate of capacitor C receives the power voltage Vdd from the inverter INV. When the control signal PHI is set at '1', transistor T2 is turned off. The first plate of capacitor C receives low reference voltage Gnd from the inverter INV, so that the voltage at the second plate of capacitor C becomes $V_{CM}$-Vdd. Transistor T1 is then turned on. The present embodiment avoids any leakage through transistor T1 in the off state during a conversion given that a negative voltage $V_n$ may then be present on the source of transistor T1.

Figure 7:
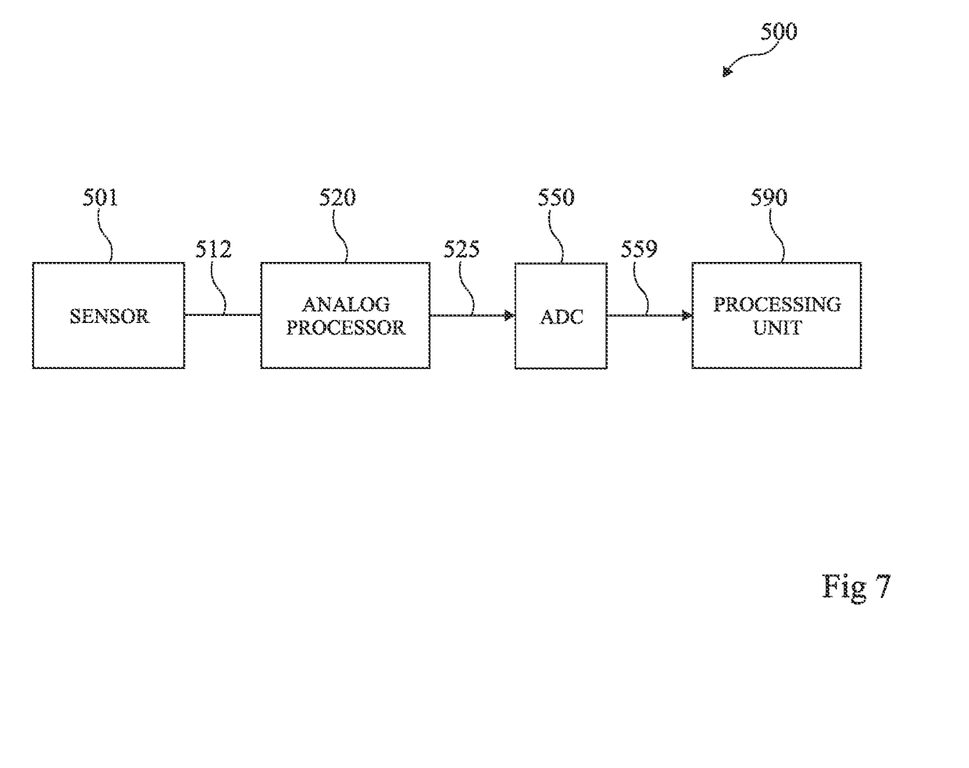
FIG. 7 is a block diagram of a sensing system incorporating the multichannel SA-ADC of FIGS. 3A and 3B.

FIG. 7 is a block diagram of an example sensing system 500. The sensing system 500 may correspond to an image sensor. Sensing system 500 is shown containing a sensor 501, an analog processor 520, an ADC 550, and a processing unit 590.

Sensor 501 may receive radiation and provide analog signals to analog processor 520 on path 512 for further processing. Analog processor 520 may perform tasks such as amplification (or attenuation as desired), filtering, etc., on the received analog signals and provides the resulting processed analog signals on path 525.

ADC 550 converts the analog signals received on path 525 to corresponding digital values, which are provided on path 559 for further processing. ADC 550 may be implemented as a SA-ADC according to embodiments disclosed in detail above. Processing unit 590 receives the data values on path 559 and processes the data values to provide various user applications.

Various embodiments and variants have been described. Those skilled in the art will understand that certain features of these various embodiments and variants may be combined, and other variants will occur to those skilled in the art. Finally, the practical implementation of the described embodiments and variations is within the abilities of those skilled in the art based on the functional indications given hereabove. In particular, there exist different SAR methods that can be implemented by the SAR logic 13.

The invention claimed is:

1. A successive approximation analog-to-digital converter, comprising:
   a digital-to-analog converter configured to receive a digital signal, said digital-to-analog converter comprising:
      first conversion units, each first conversion unit being configured to sample an analog signal via a first switch and output a first level voltage;
      a single second conversion unit configured to provide a second level voltage;
      wherein each first conversion unit comprises a first capacitor array and a set of said first switches controlled by the digital signal;
      wherein the second conversion unit comprises a second capacitor array and a set of second switches;
   a set of third switches, wherein said set of third switches comprises a third switch for each first conversion unit, each third switch configured to selectively pass the first level voltage;
   a comparator configured to selectively receive the first level voltages from the set of third switches and operating to compare each received first level voltage to the second level voltage and to provide a comparison signal based on each comparison;
   a successive approximation logic circuit configured to provide the digital signal based on the comparison signal generated by the comparator; and
   a control circuit configured to close the first switches simultaneously and close the third switches successively for the conversion of each sampled analog signal;
   wherein, for each first conversion unit, the first capacitor array comprises first capacitors, each first capacitor having a first plate connected to an output and a second plate connected through a switch to the analog signal, and, for each first capacitor, a switch connecting the second plate of the first capacitor to a first reference voltage and a switch connecting the second plate of the first capacitor to a second reference voltage;
   wherein each first conversion unit further comprises a switch connecting the first plate of each first capacitor to the first reference voltage that comprises:
      a first MOS transistor, the drain of the first MOS transistor receiving the first reference voltage, and the source of the first MOS transistor receiving the first level voltage;
      a second MOS transistor, the source of the second MOS transistor receiving a third reference voltage, the drain of the second MOS transistor being connected to the gate of the first MOS transistor, and the gate of the second MOS transistor receiving a command signal;

a third capacitor having a first plate connected to the gate of the first MOS transistor; and
an inverter having its output connected to the second plate of the third capacitor and receiving the command signal.

2. The converter of claim 1, wherein the second conversion unit is configured to sample a first reference voltage and generate the second level voltage, and further comprising a fourth switch between an output of the second conversion unit and the comparator to selectively pass the second level voltage in response to the control circuit.

3. A successive approximation analog-to-digital converter, comprising:
a digital-to-analog converter configured to receive a digital signal, said digital-to-analog converter comprising:
first conversion units, each first conversion unit being configured to sample an analog signal via a first switch and output a first level voltage;
a single second conversion unit configured to provide a second level voltage;
wherein each first conversion unit comprises a first capacitor array and a set of said first switches controlled by the digital signal;
wherein the second conversion unit comprises a second capacitor array and a set of second switches;
a set of third switches, wherein said set of third switches comprises a third switch for each first conversion unit, each third switch configured to selectively pass the first level voltage;
a comparator configured to selectively receive the first level voltages from the set of third switches and operating to compare each received first level voltage to the second level voltage and to provide a comparison signal based on each comparison;
a successive approximation logic circuit configured to provide the digital signal based on the comparison signal generated by the comparator; and
a control circuit configured to close the first switches simultaneously and close the third switches successively for the conversion of each sampled analog signal;
wherein second capacitor array of the second conversion unit comprises second capacitors, each second capacitor having a first plate coupled to an output and a second plate, and, for each second capacitor, a switch connecting the second plate of the second capacitor to a first reference voltage and a switch connecting the second plate of the second capacitor to a second reference voltage;
wherein the second conversion unit further comprises a switch connecting the first plate of each second capacitor to the first reference voltage that comprises:
a first MOS transistor, the drain of the first MOS transistor receiving the first reference voltage, and the source of the first MOS transistor receiving the second level voltage;
a second MOS transistor, the source of the second MOS transistor receiving a third reference voltage, the drain of the second MOS transistor being connected to the gate of the first MOS transistor, and the gate of the second MOS transistor receiving a command signal;
a third capacitor having a first plate connected to the gate of the first MOS transistor; and
an inverter having its output connected to the second plate of the third capacitor and receiving the command signal.

4. A sensing device, comprising:
a sensor providing unshaped analog signals;
an analog processor receiving the unshaped analog signals and providing shaped analog signals; and
a successive approximation analog-to-digital converter of claim 1 receiving the shaped analog signals and providing, for each shaped analog signals, a digital signal corresponding to the analog-to-digital conversion of the shaped analog signal, and a processing unit receiving the digital signals.

5. The sensing device of claim 4, wherein the sensor comprises photodetectors.

6. A successive approximation analog-to-digital converter, comprising:
a digital-to-analog converter configured to receive a digital signal, said digital-to-analog converter comprising:
first conversion units, each first conversion unit being configured to sample an analog signal via a first switch and output a first level voltage;
a single second conversion unit configured to provide a second level voltage;
wherein each first conversion unit comprises a first capacitor array and a set of said first switches controlled by the digital signal;
wherein the second conversion unit comprises a second capacitor array and a set of second switches;
a comparator configured to receive the first level voltages and operating to compare each of the first level voltages to the second level voltage and to provide a comparison signal based on each comparison and actuation of a set of third switches;
wherein said comparator comprises:
a plurality of pre-amplifier comparison stages; and
a latch stage;
wherein the first level voltage of each first conversion unit is applied to an input of a corresponding pre-amplifier comparison stage and the second level voltage is applied another input of each pre-amplifier comparison stage; and
wherein said set of third switches comprises a third switch for each of the pre-amplifier comparison stages, each third switch configured to selectively pass an output of the pre-amplifier comparison stage to an input of the latch stage;
a successive approximation logic circuit configured to provide the digital signal based on the comparison signal generated by the latch stage; and
a control circuit configured to close the first switches simultaneously and close the third switches successively for the conversion of each sampled analog signal;
wherein, for each first conversion unit, the first capacitor array comprises first capacitors, each first capacitor having a first plate connected to an output and a second plate connected through a switch to the analog signal, and, for each first capacitor, a switch connecting the second plate of the first capacitor to a first reference voltage and a switch connecting the second plate of the first capacitor to a second reference voltage;
wherein each first conversion unit further comprises a switch connecting the first plate of each first capacitor to the first reference voltage that comprises:
a first MOS transistor, the drain of the first MOS transistor receiving the first reference voltage, and the source of the first MOS transistor receiving the first level voltage;

a second MOS transistor, the source of the second MOS transistor receiving a third reference voltage, the drain of the second MOS transistor being connected to the gate of the first MOS transistor, and the gate of the second MOS transistor receiving a command signal;

a third capacitor having a first plate connected to the gate of the first MOS transistor; and an inverter having its output connected to the second plate of the third capacitor and receiving the command signal.

7. The converter of claim 6, wherein the second conversion unit is configured to sample a first reference voltage and generate the second level voltage, and further comprising a fourth switch between an output of the second conversion unit and the comparator to selectively pass the second level voltage in response to the control circuit.

8. A successive approximation analog-to-digital converter, comprising:

a digital-to-analog converter configured to receive a digital signal, said digital-to-analog converter comprising:
  first conversion units, each first conversion unit being configured to sample an analog signal via a first switch and output a first level voltage;
  a single second conversion unit configured to provide a second level voltage;
  wherein each first conversion unit comprises a first capacitor array and a set of said first switches controlled by the digital signal;
  wherein the second conversion unit comprises a second capacitor array and a set of second switches;

a comparator configured to receive the first level voltages and operating to compare each of the first level voltages to the second level voltage and to provide a comparison signal based on each comparison and actuation of a set of third switches;

wherein said comparator comprises:
  a plurality of pre-amplifier comparison stages; and
  a latch stage;
    wherein the first level voltage of each first conversion unit is applied to an input of a corresponding pre-amplifier comparison stage and the second level voltage is applied another input of each pre-amplifier comparison stage; and
    wherein said set of third switches comprises a third switch for each of the pre-amplifier comparison stages, each third switch configured to selectively pass an output of the pre-amplifier comparison stage to an input of the latch stage;
  a successive approximation logic circuit configured to provide the digital signal based on the comparison signal generated by the latch stage; and a control circuit configured to close the first switches simultaneously and close the third switches successively for the conversion of each sampled analog signal;

wherein second capacitor array of the second conversion unit comprises second capacitors, each second capacitor having a first plate coupled to an output and a second plate, and, for each second capacitor, a switch connecting the second plate of the second capacitor to a first reference voltage and a switch connecting the second plate of the second capacitor to a second reference voltage;

wherein the second conversion unit comprises a switch connecting the first plate of each second capacitor to the first reference voltage that comprises:

a first MOS transistor, the drain of the first MOS transistor receiving the first reference voltage, and the source of the first MOS transistor receiving the second level voltage;

a second MOS transistor, the source of the second MOS transistor receiving a third reference voltage, the drain of the second MOS transistor being connected to the gate of the first MOS transistor, and the gate of the second MOS transistor receiving a command signal;

a third capacitor having a first plate connected to the gate of the first MOS transistor; and an inverter having its output connected to the second plate of the third capacitor and receiving the command signal.

9. A sensing device, comprising:
a sensor providing unshaped analog signals;
an analog processor receiving the unshaped analog signals and providing shaped analog signals; and
a successive approximation analog-to-digital converter of claim 6 receiving the shaped analog signals and providing, for each shaped analog signals, a digital signal corresponding to the analog-to-digital conversion of the shaped analog signal, and a processing unit receiving the digital signals.

10. The sensing device of claim 9, wherein the sensor comprises photodetectors.

11. The converter of claim 3, wherein the second conversion unit is configured to sample a first reference voltage and generate the second level voltage, and further comprising a fourth switch between an output of the second conversion unit and the comparator to selectively pass the second level voltage in response to the control circuit.

12. A sensing device, comprising:
a sensor providing unshaped analog signals;
an analog processor receiving the unshaped analog signals and providing shaped analog signals; and
a successive approximation analog-to-digital converter of claim 3 receiving the shaped analog signals and providing, for each shaped analog signals, a digital signal corresponding to the analog-to-digital conversion of the shaped analog signal, and a processing unit receiving the digital signals.

13. The sensing device of claim 12, wherein the sensor comprises photodetectors.

14. The converter of claim 8, wherein the second conversion unit is configured to sample a first reference voltage and generate the second level voltage, and further comprising a fourth switch between an output of the second conversion unit and the comparator to selectively pass the second level voltage in response to the control circuit.

15. A sensing device, comprising:
a sensor providing unshaped analog signals;
an analog processor receiving the unshaped analog signals and providing shaped analog signals; and
a successive approximation analog-to-digital converter of claim 8 receiving the shaped analog signals and providing, for each shaped analog signals, a digital signal corresponding to the analog-to-digital conversion of the shaped analog signal, and a processing unit receiving the digital signals.

16. The sensing device of claim 15, wherein the sensor comprises photodetectors.

* * * * *